United States Patent [19]
Diorio et al.

[11] Patent Number: 6,125,053
[45] Date of Patent: Sep. 26, 2000

[54] SEMICONDUCTOR STRUCTURE FOR LONG-TERM LEARNING

[75] Inventors: Christopher J. Diorio, Torrance; Carver A. Mead, Pasadena, both of Calif.

[73] Assignee: California Institute of Technology, Pasadena, Calif.

[21] Appl. No.: 09/201,677

[22] Filed: Nov. 30, 1998

Related U.S. Application Data

[62] Division of application No. 08/882,717, Jun. 25, 1997, Pat. No. 5,898,613
[60] Provisional application No. 60/022,360, Jul. 24, 1996.

[51] Int. Cl.[7] .................................................. G11C 16/04
[52] U.S. Cl. .............................. 365/185.03; 365/185.28; 257/315
[58] Field of Search ......................... 365/185.03, 185.28, 365/185.1; 257/315

[56] References Cited

U.S. PATENT DOCUMENTS

| | | | |
|---|---|---|---|
| 5,864,242 | 6/1999 | Allen et al. | 365/185.28 |
| 5,914,894 | 6/1999 | Diorio et al. | 365/185.03 |

*Primary Examiner*—Huan Hoang
*Attorney, Agent, or Firm*—D'Alessandro & Ritchie

[57] ABSTRACT

A pMOS EEPROM cell includes a source, drain, channel, control gate and well contact. The device is a fully functional single element p-type floating gate MOSFET. A floating gate overlaps the well contact and completely surrounds the drain and source implants. The pMOS cell is written to by means of hot-electron injection, using an intrinsic feedback mechanism to write analog values. Hot electrons are generated in the channel by means of hole impact ionization at the transistor's drain. The pMOS cell is erased by Fowler-Nordheim tunneling. The tunneling voltage is applied only to the well to tunnel electrons from the floating gate. The well-source and well-drain junctions are protected from breakdown by means of guard rings.

5 Claims, 11 Drawing Sheets

ELECTRON BAND DIAGRAM 5,125,053

SEMICONDUCTOR STRUCTURE FOR LONG-TERM LEARNING

This application is a division of application Ser. No. 08/882,717, filed Jun. 25, 1997, now U.S. Pat. No. 5,898,613.

REFERENCE TO RELATED PROVISIONAL PATENT APPLICATION

This application claims the benefit of U.S. Provisional Patent Application Ser. No. 60/022,360, filed Jul. 24, 1996, and entitled "A pMOS ANALOG EEPROM CELL", the entirety of which is hereby incorporated herein by reference as if set forth in full herein and a CIP of Ser. No. 08/721,261 Sep. 26, 1996 U.S. Pat. No. 5,875,126, and a CIP of Ser. No. 08/690,198 Jul. 26, 1996 U.S. Pat. No. 5,825,063

CROSS-REFERENCE TO RELATED APPLICATIONS

This application is a continuation-in-part of the following co-pending U.S. patent applications in the name of the inventors hereof (and others) and bearing the Ser. Nos., filing dates and titles shown below. Each is hereby incorporated herein by reference as if set forth in full herein.

Ser. No. 08/721,261 Filing date Sep. 26, 1996 Title An Autozeroing Floating Gate Amplifier Ser. No. 08/690,198 Filing Date Jul. 26, 1996 Title A Three Terminal Silicon Synaptic Device Ser. No. 08/845,018 Filing Date Apr. 22, 1997 Title Hole Impact Ionization Mechanism of Hot Electron Injection and Four-Terminal pFET Semiconductor Structure for Long-Term Learning Additionally incorporated by reference as if set forth fully herein is U.S. Pat. No. 5,627,392, dated May 6, 1997 (U.S. patent application Ser. No. 08/399,966 filed Mar. 7, 1995) and entitled "A Semiconductor Structure for Long Term Learning."

STATEMENT AS TO RIGHTS TO INVENTIONS

The present invention was made with support from the United States Government under Grant number N00014-89-J-1675 awarded by the Office of Naval Research of the Department of the Navy and under Grant number N00014-89-J-3083 awarded by the Advanced Research Projects Agency of the Department of Defense. The United States Government has certain rights in the invention.

BACKGROUND OF THE INVENTION

1. Field of the Invention

The present invention is directed to an analog memory cell. More particularly, the present invention is directed to an analog EEPROM (electrically erasable programmable read only memory) device for use in storage and retrieval of analog signals on a floating gate. Still more particularly the present invention is directed to a pMOS analog EEPROM cell using Impact Ionization to generate hot electrons for injection from the drain-channel depletion region to the floating gate and Fowler-Nordheim tunneling to remove electrons from the floating gate.

2. The Background Art

A primary goal of the research leading to the present invention is the development of silicon learning systems and analog memory-storage systems. One impediment to achieving these goals has been the lack of a simple circuit element combining nonvolatile analog memory storage with locally computed memory updates. Prior efforts typically used capacitive storage with clocked refresh as described in B. Hochet, et al., "Implementation of a Learning Kohonen Neuron Based on a New Multilevel Storage Technique," IEEE *J. Solid-State Circuits,* vol. 26, no. 3, pp. 262–267, 1991, or storage of a multi-bit digital equivalent word as described in P. Hollis and J. Paulos, "A Neural Network Learning Algorithm Tailored for VLSI Implementation," IEEE *Trans. Neural Networks,* vol. 5, no. 5, pp. 784–791, 1994. Such approaches result in large and complex devices which are usually power hungry. Nonvolatile floating-gate devices, such as EEPROM transistors, typically are optimized for binary-valued data storage rather than analog use (see, e.g., F. Masuoka, R. Shirota, and K Saku, "Reviews and prospects of non-volatile semiconductor memories," IEICE *Trans., vol. E* 74, no. 4, pp. 868–874, 1991), and do not compute their own memory updates.

Unlike conventional EEPROM transistors, the guarded-pFET synapse described herein allow simultaneous memory reading and writing. Consequently, it is possible to apply continuous negative feedback during the write process to store an analog memory value in a single-step write. This process is called self-convergent writing: an intrinsic, self-limiting feedback path within the transistor itself ensures that the analog memory value is stored accurately.

To achieve a substantial improvement over current technology silicon learning systems, a single transistor learning device with the following attributes would be very valuable:

1. Non-volatile analog storage;
2. Bi-directional memory writing;
3. Support for simultaneous memory reading and writing;
4. On-chip read/write driver circuitry operating off of a single polarity voltage supply;
5. Self-convergent memory writing;
6. Low power consumption;
7. Compact size; and
8. Compatibility with standard silicon MOS processing.

Prior art floating gate transistors, which use electrical charge stored on a floating polysilicon gate embedded in an insulator such as silicon dioxide, provide suitable nonvolatile analog storage. The charge on such a floating gate is known to remain fixed for periods of many years. Although the advantages of using floating gate transistors as memory elements are well known, J. Lazzaro, et al., "Systems Technologies for Silicon Auditory Models," IEEE Micro, Vol. 14, no. 3, pp. 7–15, 1994, T. Allen, et al., "Writable Analog Reference Voltage Storage Device," U.S. Pat. No. 5,166,562, 1991, their application to silicon learning networks and analog memory cells has been limited. The principal reason has been the lack of suitable bi-directional and self-convergent mechanisms for writing the analog memory. Since the gate of a floating gate transistor is completely embedded within an insulator, writing the memory involves moving charge carriers through this insulator. Many mechanisms are known which will move electrons through an insulator. Two of the most common and most easily controlled methods are tunneling and hot-electron injection. The inherent difficulty in performing these operations has been the primary impediment to implementation of floating gate transistors in silicon learning and analog memory systems.

The difficulty in transporting electrons across the barrier presented by the silicon/oxide interface is depicted in FIG. 1. Surmounting the barrier 10 requires that an electron possess more than about 3.2 eV of energy. At room temperature the probability that semiconductor electrons will possess this energy is exceedingly small. Alternatively, an electron could tunnel through this barrier; however, at the voltages and oxide thicknesses used in conventional silicon MOS processing, the tunneling probability is also exceedingly small.

Fowler-Nordheim (FN) tunneling involves applying a voltage across the oxide 12, as shown in FIG. 2 which enhances the probability of an electron tunneling through it. Tunneling current versus oxide voltage for a 400 Å $SiO_2$ gate oxide typical of a 2 $\mu$m MOS process is shown in FIG. 3. Bi-directional currents through the oxide are required to achieve the learning and unlearning functions necessary in a silicon learning cell, and the writing and erasing necessary in an analog memory cell. Although the tunneling process has no preferred direction, bi-directional tunneling requires either dual polarity high voltages, or a single polarity high voltage and a means for pulling the floating gate to this voltage when adding electrons, and pulling it near ground when removing them. Both approaches are unattractive. The dual polarity solution requires a negative voltage much lower than the substrate potential; the single polarity solution does not support simultaneous memory reading and writing or self-convergent memory writes.

Single polarity bi-directional tunneling is often used in writing digital EEPROMs. Since writing the memory involves pulling the floating gate either to the supply voltage or to ground, the EEPROM cell cannot be read during the write process. Excess charge is typically added to the floating gate to compensate for this lack of memory state feedback. Although excess charge is acceptable when writing a binary valued "digital" memory, where the exact quantity of charge is irrelevant once it exceeds the amount necessary to completely switch the device to one of its two binary states, uncertainty in the amount of charge applied to an analog memory cell results in significant memory error. Because the memory-write process is not self-convergent, analog EEPROMS use inerative writes. This need has not been satisfied adequately by commercial nFET EEPROMs, primarily because conventional EEPROM transistors do not permit simultaneous memory reading and writing. Most analog EEPROM implementations require iterative writes: the memory first is written, then is read; the written and read values then are compared, and the error is used to write a correction. This cycle is repeated until the error is within prescribed bounds.

Hot-electron injection is a process whereby electrons near the surface of a semiconductor acquire more than about 3.2 eV of energy, typically by acceleration in an electric field, and then surmount the silicon/oxide barrier. Once in the silicon dioxide conduction band, an electric field applied across the oxide carries these electrons to the floating gate. There are a number of ways of accomplishing hot-electron injection.

One source for a high electric field is the collector-to-base depletion region of either a vertical or lateral bipolar junction transistor (BJT). An example of a lateral BJT used in a similar application is shown in U.S. Pat. No. 4,953,928 to Anderson, et al. Although this device is suitable for analog learning applications, each learning cell requires both an injection BJT and a MOSFET, the former to effect hot-electron injection and the latter to read the stored charge. A reduction in the number of transistors per cell would be highly desirable.

Another source for a high electric field is in the channel region of a split-gate n-type MOSFET. Split-gate injectors, as shown and described in U.S. Pat. No. 4,622,656 to Kamiya, et al., contain two partially overlapping gate regions at very different voltages. The resulting surface potential drops abruptly at the interface between the two gates, creating a high electric field localized in this small region of the transistor channel. Unfortunately, since the control gate modulates the injection rate but does not receive the injected charge, the memory cannot be both written and read simultaneously. Such a device is acceptable for digital EEPROMs but is unsuitable for analog learning cell or analog memory applications.

A third source for high electric field is the drain to source voltage dropped across the channel region of an above-threshold sub-micron n-type MOSFET. The disadvantage of this device is that in order to achieve injection, both the drain and gate voltages must exceed approximately 2.5 volts which results in high channel current and consequent high power consumption.

A fourth source for high electric field is the drain to channel depletion region formed in an n-type MOSFET. In a conventional MOSFET, as depicted in FIGS. 4–5, this field only exists when the drain-to-source voltage exceeds 2.5 volts and the transistor is operated at or near its subthreshold regime. Since subthreshold MOSFET gate voltages are typically less than one volt, electrons injected into the gate oxide encounter a large electric field directed towards the transistor drain, opposing their transport to the floating gate. The resulting charge transfer to the floating gate is negligibly small as can be seen in the FIG. 5 energy band diagram of the transistor of FIG. 4.

Accordingly, there is a need for an improved silicon analog memory cell which can be written and erased, which can be written and read simultaneously, and which can be realized in a single device.

SUMMARY OF THE INVENTION

A pMOS EEPROM cell includes a source, drain, channel, control gate and well contact The device is a fully functional single element p-type floating gate MOSFET. A floating gate overlaps the well contact and completely surrounds the drain and source implants. The pMOS cell is written to by means of hot-electron injection, using an intrinsic self-convergent feedback mechanism to write analog values. Hot electrons are generated in the channel by means of hole impact ionization at the transistor's drain. The pMOS cell is erased by Fowler-Nordheim tunneling. The tunneling voltage is applied only to the well to tunnel electrons from the floating gate. The well-source and well-drain junctions are protected from breakdown by means of floating-gate guard rings.

OBJECTS AND ADVANTAGES OF THE INVENTION

Accordingly, it is an object and advantage of the present invention to provide an improved analog memory device.

It is a further object and advantage of the present invention to provide a novel silicon synaptic device.

It is a further object and advantage of the present invention to provide a pFET analog memory device.

It is a further object and advantage of the present invention to provide a pFET analog memory device with self-convergent memory writes.

It is a further object and advantage of the present invention to provide a four terminal single transistor pFET analog memory device.

It is a further object and advantage of the present invention to provide a single transistor four terminal analog memory cell.

It is a further object and advantage of the present invention to provide a memory cell capable of use in an extremely high density memory system.

It is a further object and advantage of the present invention to provide a single transistor analog memory cell that supports simultaneous memory reading and writing.

It is a further object and advantage of the present invention to provide a single transistor analog memory cell with a time-varying transfer function that is a component in the circuit used to write its own memory where the time-varying transfer function implements a learning function.

It is a further object and advantage of the present invention to provide a single transistor analog memory cell with a time-varying transfer function that is a component in the circuit used to write its own memory where the time-varying transfer function implements a learning function and the learning function defines a learning rule which can be used in the development of learning systems.

It is a further object and advantage of the present invention to provide a single transistor analog memory cell which can support a feedback loop-type writing mechanism.

It is a further object and advantage of the present invention to provide a single transistor four-terminal device for storing analog values.

It is a further object and advantage of the present invention to provide a single transistor four-terminal device for manipulating stored values.

Yet a further object and advantage of the present invention is to provide an extremely low power, compact, analog memory device which can be incorporated into existing silicon integrated circuits and process.

These and many other objects and advantages of the present invention will become apparent to those of ordinary skill in the art from a consideration of the drawings and ensuing description of the invention.

DESCRIPTION OF THE PREFERRED EMBODIMENTS

Figure 1:
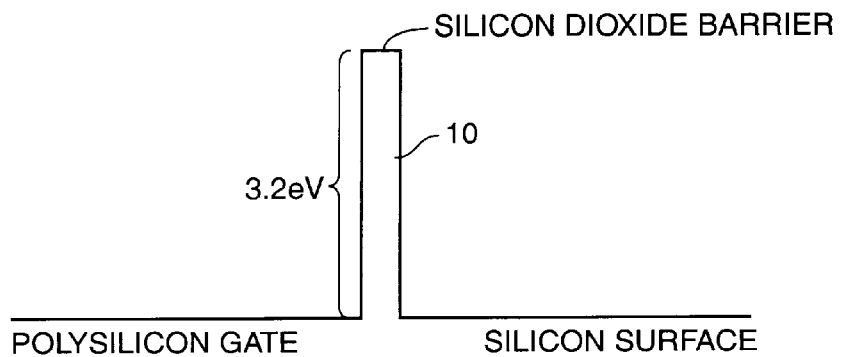
FIG. 1 is an energy band diagram showing the potential barrier faced by a conduction electron at a silicon/oxide interface.
Figure 2:
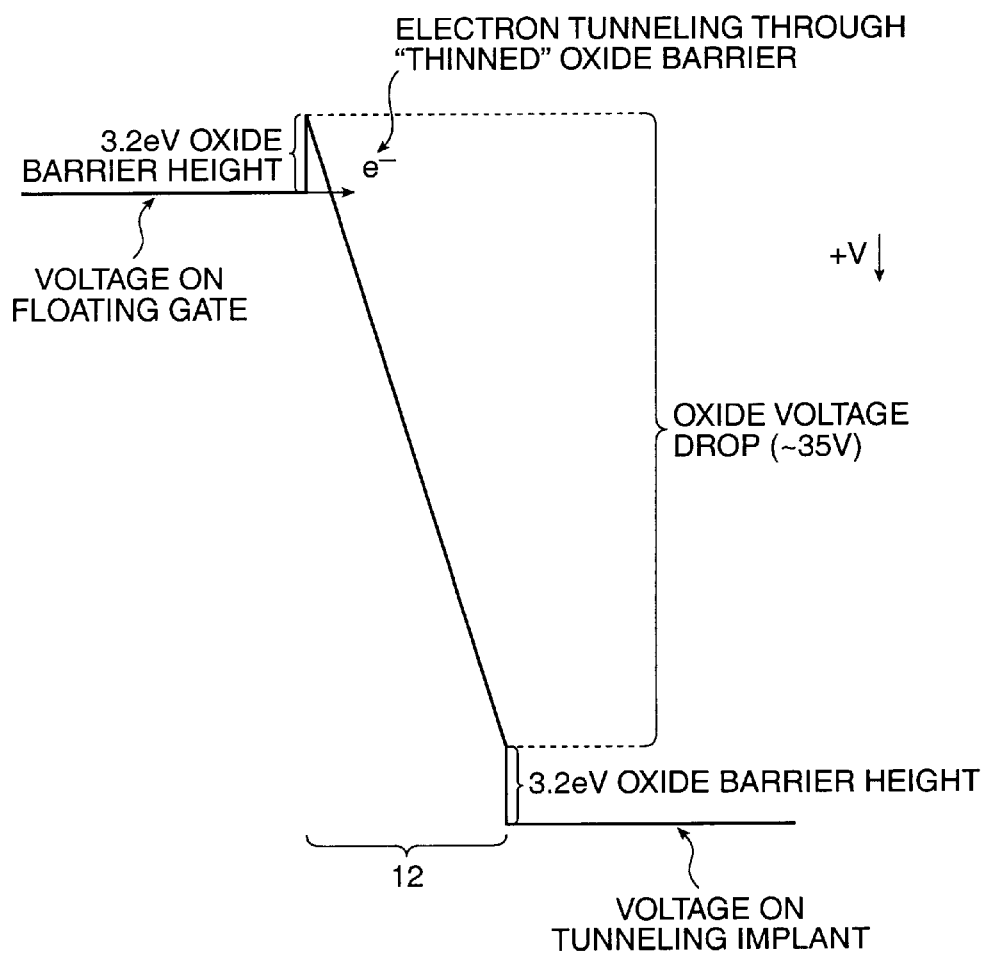
FIG. 2 is an energy band diagram showing the potential faced by an electron in silicon attempting to pass through a silicon dioxide barrier in the presence of a Fowler-Nordheim tunneling potential.
Figure 3:
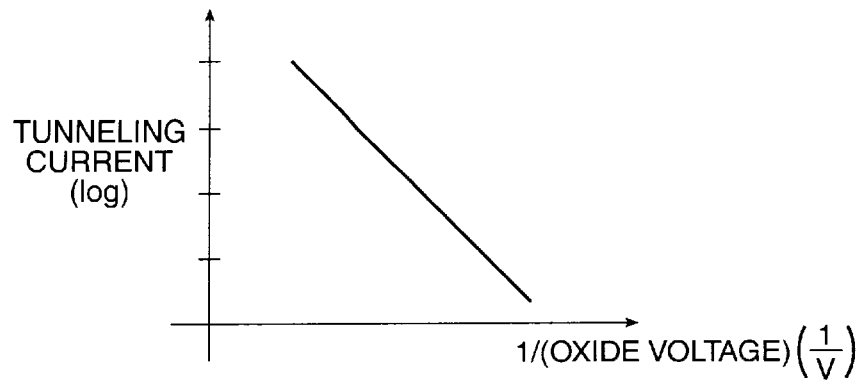
FIG. 3 is a diagram showing a semi-log plot of tunneling current versus oxide voltage for a gate oxide tunneling junction.
Figure 4:
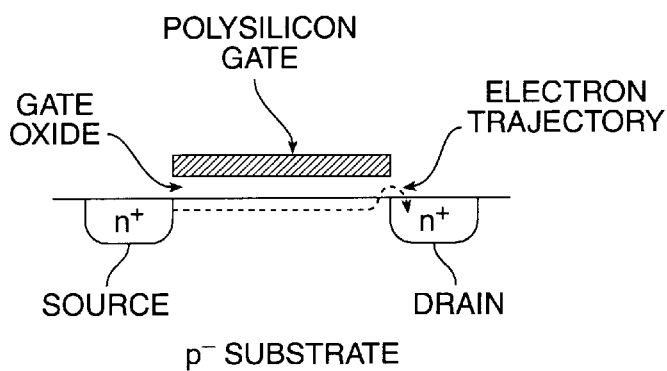
FIG. 4 is a diagram of an n-type MOSFET showing the inability to inject electrons from the channel to the gate.
Figure 5:
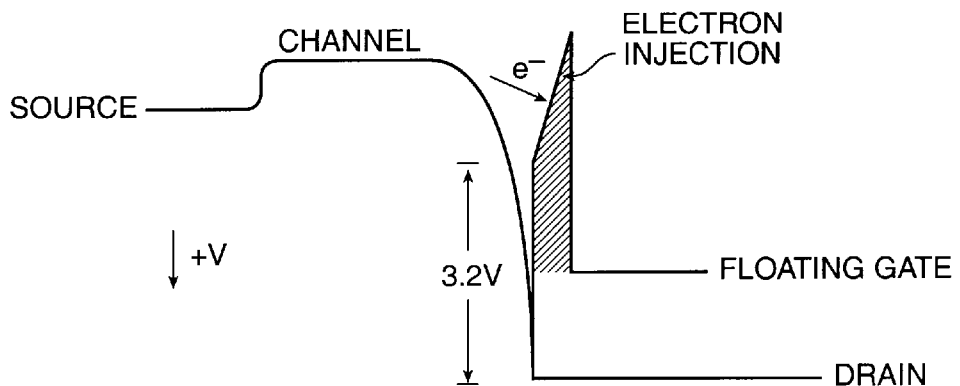
FIG. 5 is an energy band diagram of the conventional n-type MOSFET described in FIG. 4.

Those of ordinary skill in the art will realize that the following description of the present invention is illustrative only and is not intended to be in any way limiting. Other embodiments of the invention will readily suggest themselves to such skilled persons from an examination of the within disclosure.

There is a need for an analog EEPROM cell in analog-type storage applications such as speech recorders, H. V. Tran, T. Blyth et al., "A 2.5V 256-level non-volatile analog storage device using EEPROM technology," IEEE *Intl. Solid-State Circuits Conf., Dig. Tech. Papers,* pp. 270–271, 1996, and in systems such as silicon neural networks. Conventional EEPROMs typically employ n-type MOSFETs, and use Fowler-Nordheim tunneling to write the memory. Because simultaneously tunneling and reading an n-type floating-gate MOSFET is difficult, writing an analog memory usually is an iterative process. In accordance with the present invention an alternative pMOS EEPROM cell permits simultaneous memory writing and reading, thereby allowing accurate, single-step analog writes. In addition, the cell preferably operates from a single-polarity supply, and is preferably fabricated in a standard n-well, double-poly CMOS process. As shown in FIGS. 6A, 6B, 6C and 6D, this new memory cell 14 has three notable features: (1) it employs a fully functional p-type floating-gate MOSFET in a single n- well, (2) its polysilicon floating gate 16 abuts $n^+$ well contact 18, and (3) its floating gate 16 surrounds completely the drain 18 and source 20 implants.

The Memory Cell

Figure 6A:
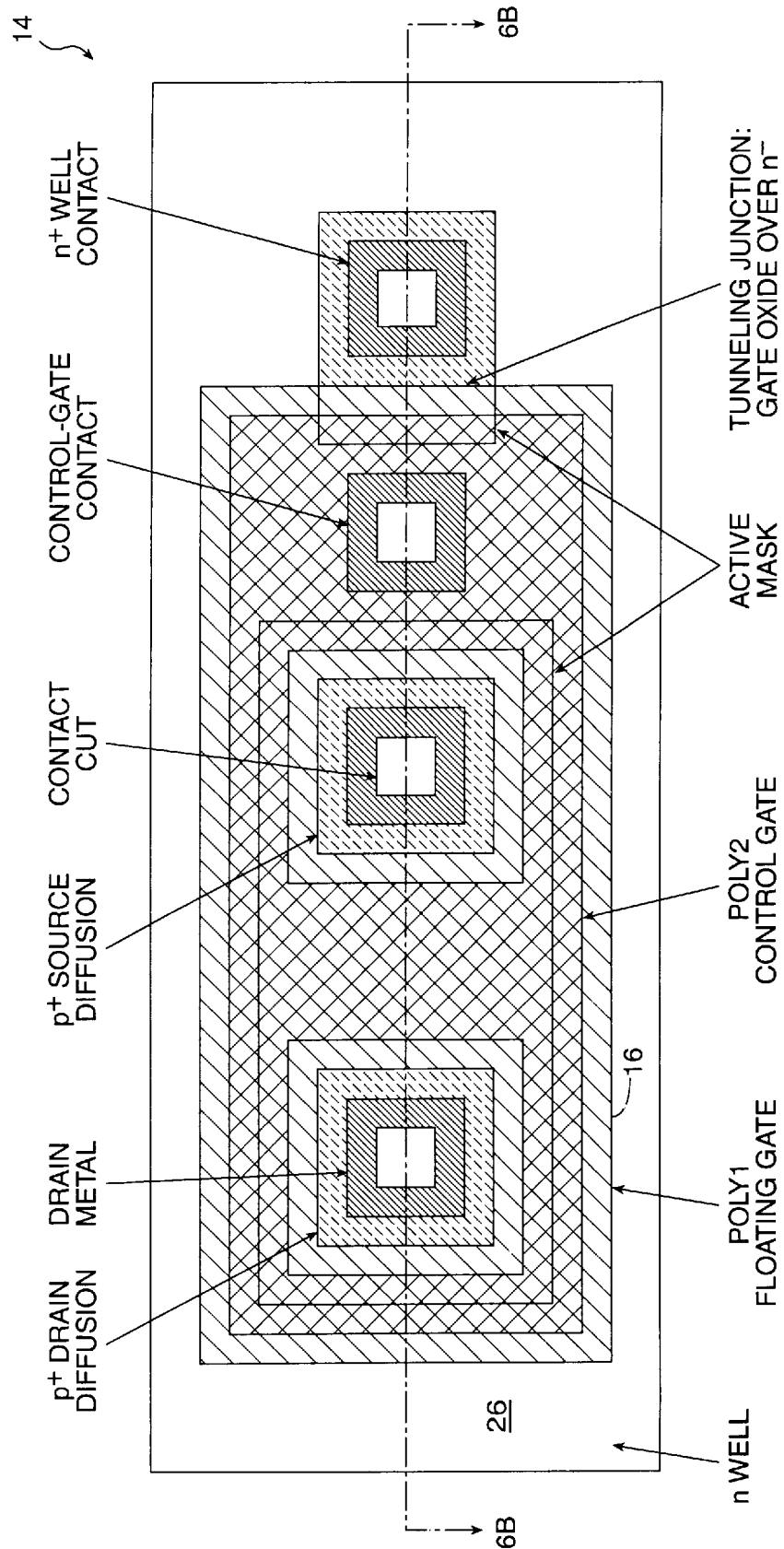
FIG. 6A is a top view of a pMOS analog EEPROM cell in accordance with a presently preferred embodiment of the present invention.
Figure 6B:
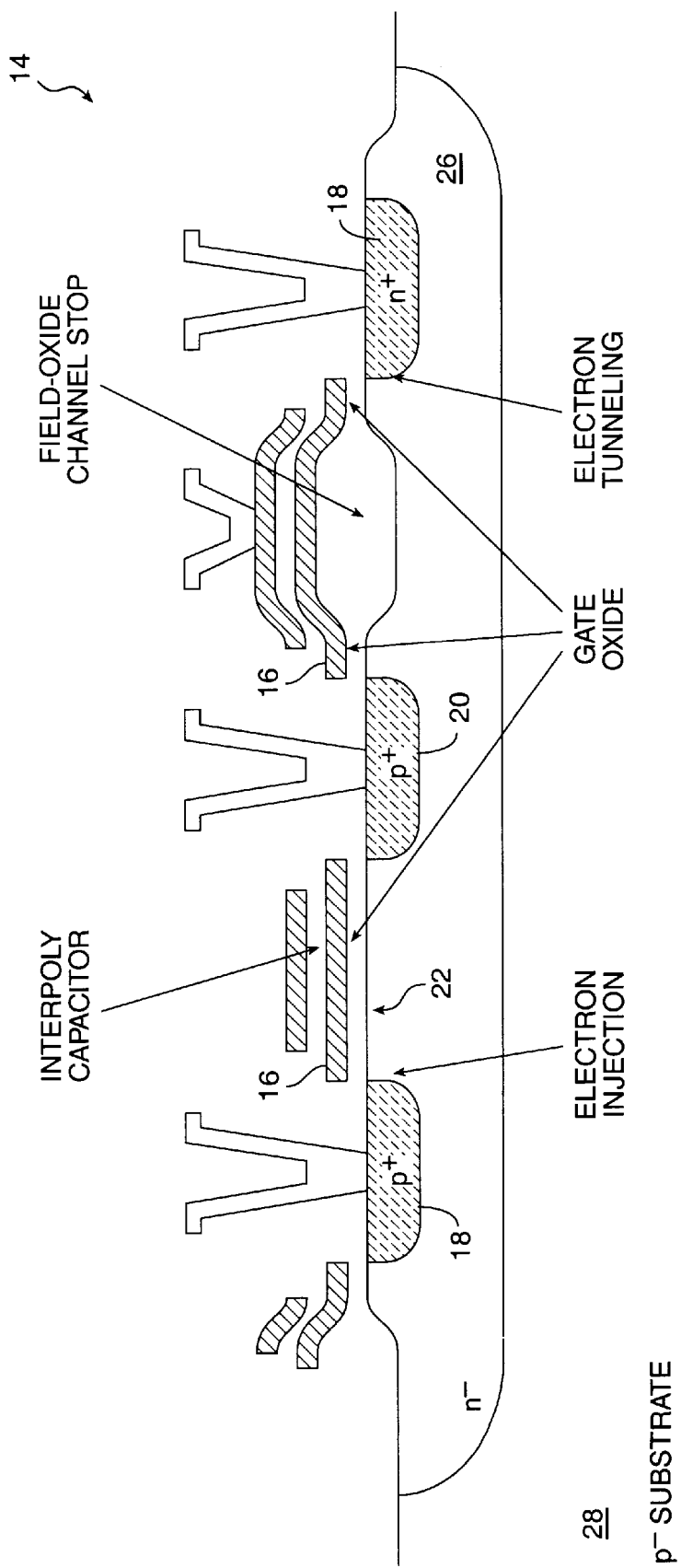
FIG. 6B is a cross sectional view taken along line 6B—6B of FIG. 6A of a pMOS analog EEPROM cell in accordance with a presently preferred embodiment of the present invention.
Figure 6C:
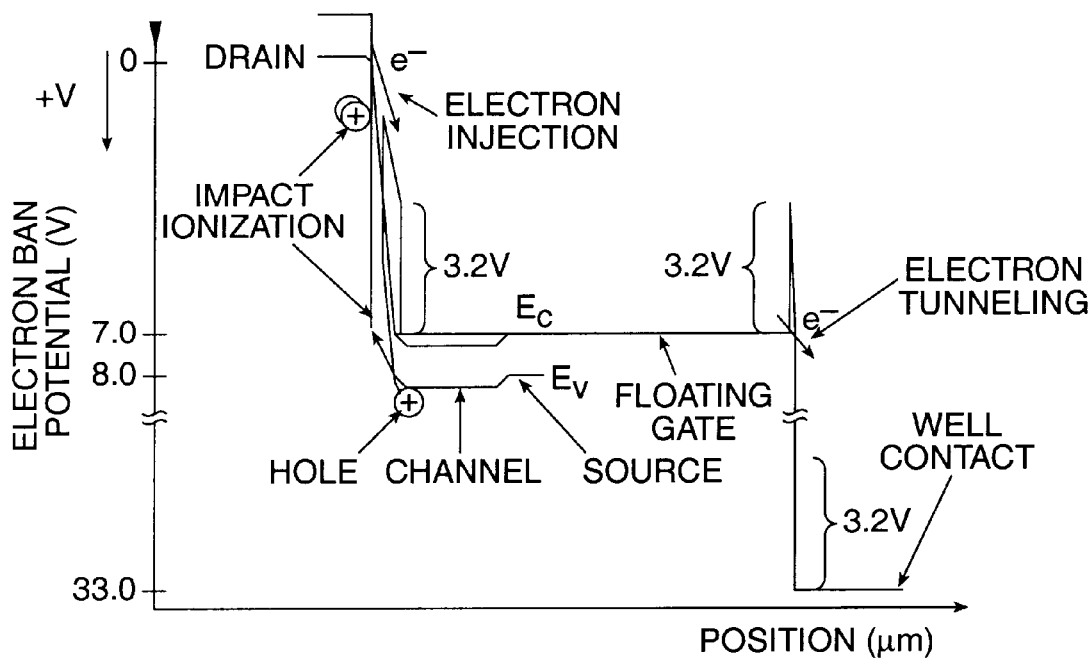
FIG. 6C is an electron band diagram of a pMOS analog EEPROM cell in accordance with a presently preferred embodiment of the present invention.
Figure 6D:
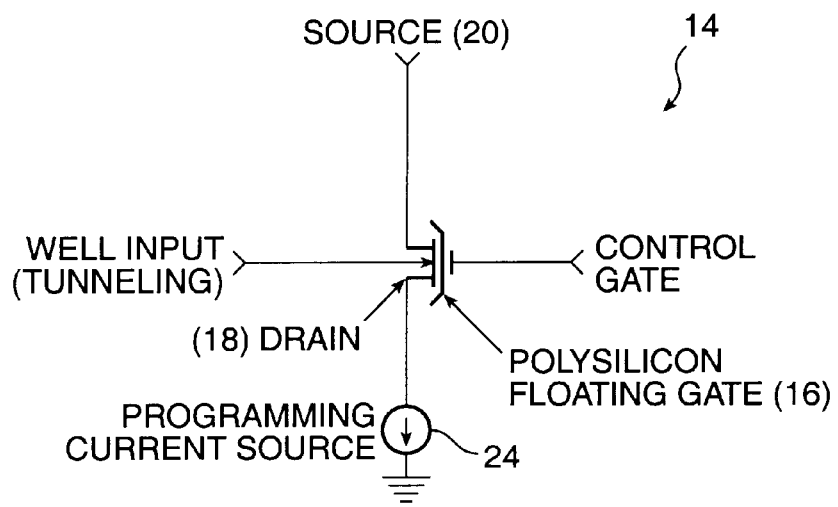
FIG. 6D is a schematic diagram of a floating gate EEPROM transistor implementing a self-convergent write process.

Turning now in more detail to the figures, FIGS. 6A, 6B and 6C depict the EEPROM transistor 14 according to the present invention, showing the tunneling and injection locations. FIG. 6D is a schematic diagram of the EEPROM transistor implementing a self-convergent write process. FIGS. 6A and 6C are drawn to scale; the vertical dimension in FIG. 6B has been exaggerated. All voltages are referenced to the source potential, and subthreshold source currents ($I_S$<100 nA) are assumed. In FIG. 6C, the gate oxide actually projects into the plane of the page; however, for clarity, it is rotated 90° and drawn in the channel direction. The memory is written by hot-electron injection, and erased by tunneling. Because the channel current comprises holes, hot electrons are generated by means of impact ionization at the drain 18. Channel holes, accelerated rapidly in the transistor's drain-to-channel E-field, collide with the semiconductor lattice to produce additional electron-hole pairs. The liberated electrons are promoted to their conduction band by the collision, and are expelled rapidly from the drain region by this same drain-to-channel E-field. Electrons that acquire more than 3.2 eV of kinetic energy can scatter upward into the gate oxide and inject onto the floating gate 16. The transistor 14 is large, and the tunneling voltages are high, because a 2 μm process with 400 Å gate oxides was used. As pointed out above, the transistor's size and tunneling voltages can be trivially reduced by using a more modern process with finer line widths and thinner gate oxides.

Writing the Cell

Figure 8:
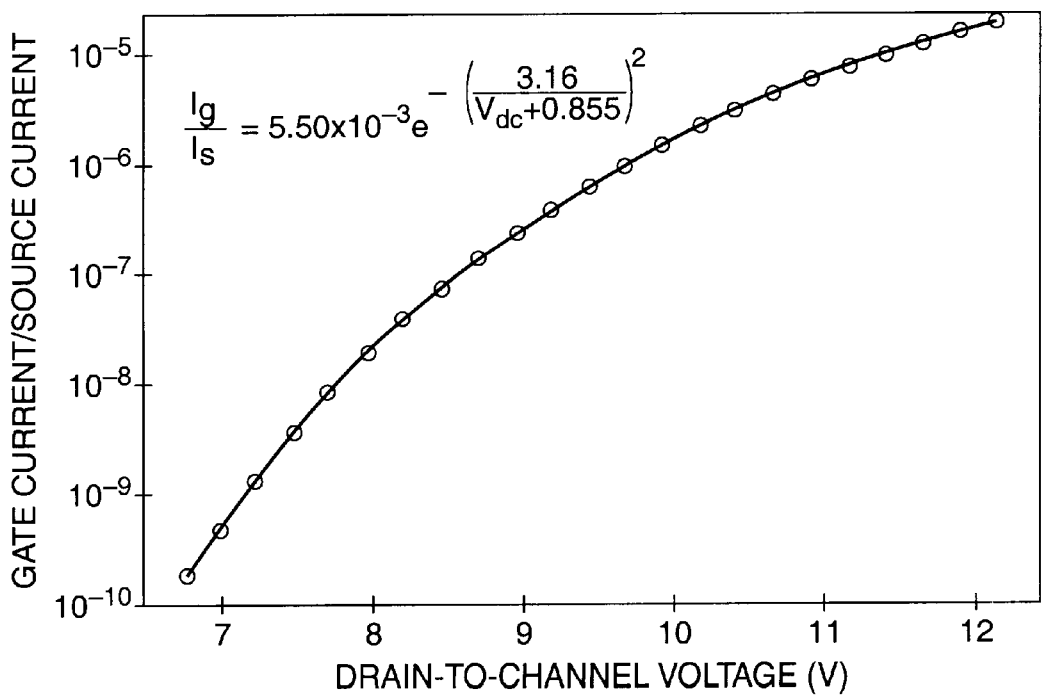
FIG. 8 is a plot of pFET gate current versus drain-to-channel potential $V_{dC}$, for a fixed, subthreshold source current $I_S$=10 nA.
Figure 9:
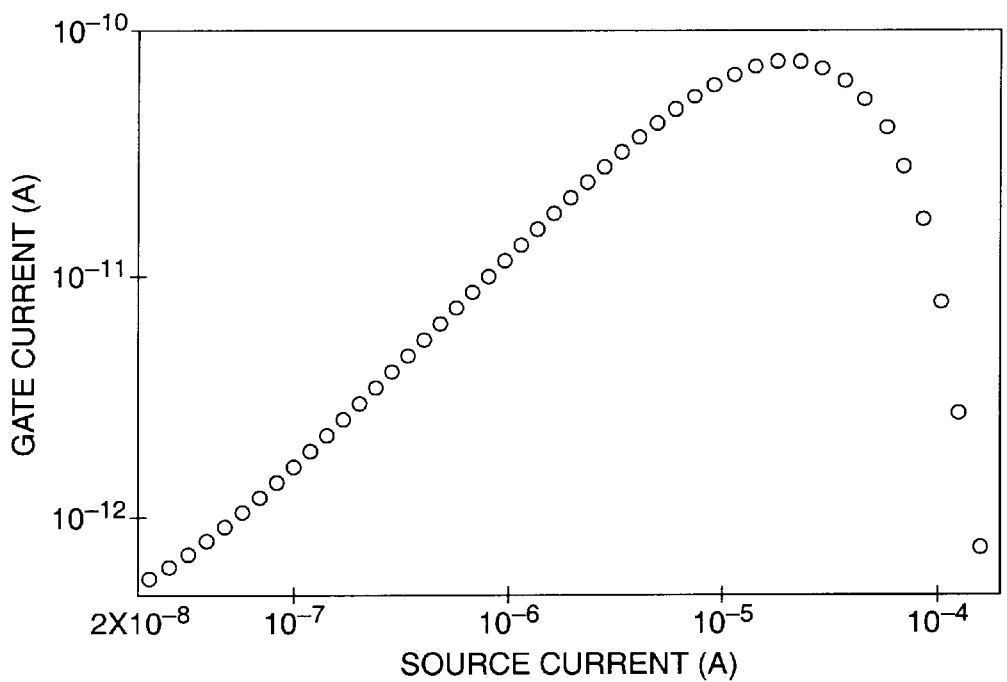
FIG. 9 is a plot of pFET gate current versus source current, for a fixed drain-to-source voltage $V_{ds}$=12V.

The pMOS memory cell 14 is written to by hot-electron injection, using an intrinsic feedback mechanism to write analog values. As shown in FIGS. 6A, 6B 6C and 7, hot electrons are generated by means of hole impact ionization at the transistor's drain 18 in the channel 22 formed between the drain 18 and the source 20. The hot-electron gate current increases with drain-to-channel voltage as depicted in FIG. 8, and with drain current as depicted in FIG. 9. Drain current is selected as the memory-cell output, and the transistor 14 is operated in its saturated regime. To write the memory, a programming current is sinked from the drain 18, using a current source 24. As long as this programming current exceeds the drain current, the drain voltage is low, and electrons inject onto the floating gate 16. Electron injection decreases the floating-gate voltage, increasing the drain current. As soon as the drain current is equal to the programming current, the drain voltage rises, turning off the injection process. Hot-electron injection closes a negative feedback loop around the inverting amplifier that is formed by the pFET and the programming current source as a depicted in, for example, P. Hasler, B. A. Minch, C. Diorio, and C. Mead, "An autozeroing amplifier using pFET hot-electron injection," *Proc.* IEEE *Intl. Symp. On Circuits and Systems,* vol 3, pp. 325–328, 1996. The memory-write process adapts the floating-gate charge, using this intrinsic feedback mechanism, to equalize the programing and pFET-drain currents.

Erasing the Cell

The memory cell is erased by Fowler-Nordheim tunneling. Whereas typical nFET memory cells use high source voltages to cause oxide tunneling, erasing a pMOS memory cell in this fashion would require that the tunneling voltage be applied not only to the source, but also to the well and drain. Because it is desirable to avoid applying high voltages to all three device terminals, instead the tunneling voltage is applied to only the well, and causes electrons to tunnel from the floating gate, through gate oxide formed where the floating gate abuts (and preferably overlies) the $n^+$ well contact (FIG. 6B), to the well contact. Unfortunately, the well voltage required for tunneling exceeds the reverse-biased breakdown voltage of the well-to-drain and well-to-source junctions. To solve this problem, the drain and source implants are guarded, A. S. Grove, *Physics and Technology of Semiconductor Devices,* New York: John Wiley & Sons, Inc., 1967, by surrounding them with the polysilicon floating gate.

Assume, for the moment, that to make the four-terminal pFET synapse smaller, one can simply merge the well containing the tunneling implant and the floating-gate pFET. The tunneling implant comprises $n^+$ doped silicon, and an n-well comprises $n^-$ doped silicon; consequently, a tunneling implant is a well contact. To induce electron tunneling, one must apply about 30V across the gate oxide separating the floating gate and the well contact. One can do this by lowering the floating gate by 30V; unfortunately, if the well potential is +12V, lowering $V_{fg}$ by 30V requires using a large negative supply voltage on chip, and precludes reading the source current during tunneling. Alternately, one can raise the well potential by 30V, but doing this will cause pn breakdown at the reverse-biased drain-to-well and source-to-well pn junctions. To prevent this pn breakdown, one can raise the drain, source, and well potentials by 30V during tunneling, but then one cannot read the synapse's source current during tunneling. Therefore, a technique called junction guarding has been employed to solve this problem.

Figure 10:
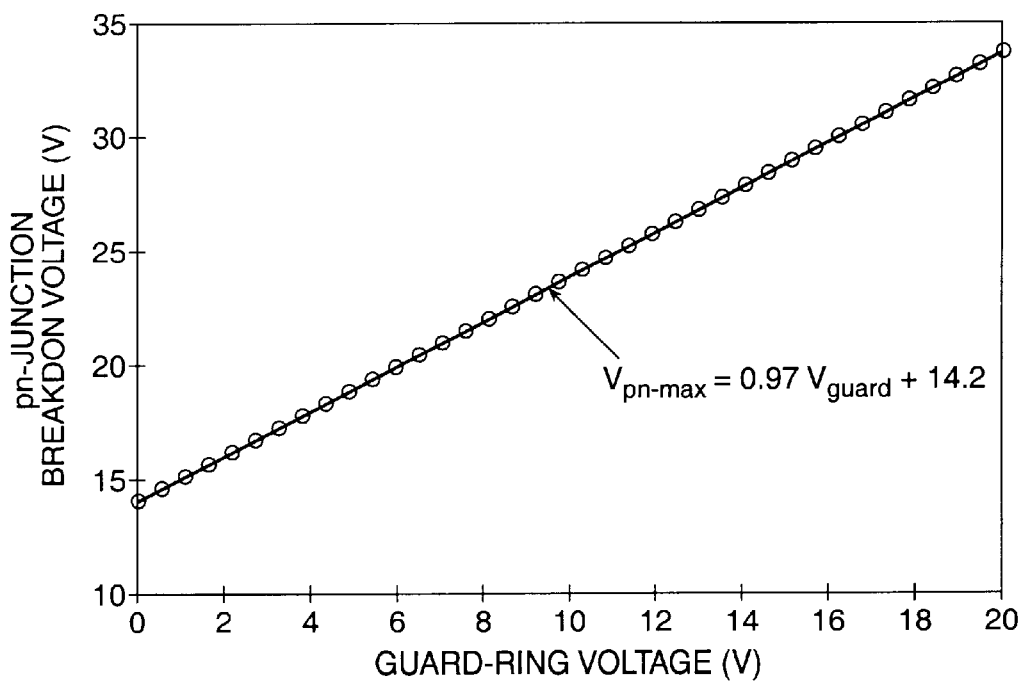
FIG. 10 is a plot of junction-diode breakdown voltage versus guard-ring voltage for a heavily-doped $n^+$ implant (in substrate) surrounded by a polysilicon-gate guard ring.

In a planar IC-fabrication technology, the implant-impurity concentrations usually are much higher near the semiconductor surface than they are in the bulk. Consequently, the electric field across a pn junction is highest at the surface, and reverse-bias junction breakdown usually occurs near the surface. Junction guarding is a well-known technique for reducing the surface electric field. By surrounding an implant with a MOS guard ring, and applying the high voltage to both the implant and the ring, the depletion region at the semiconductor surface is widened, thereby decreasing the peak electric field and increasing the junction's breakdown voltage. In FIG. 10, a plot of pn-breakdown voltage versus guard-ring voltage is shown for a heavily-doped $n^+$ implant (in substrate) surrounded by a polysilicon-gate guard ring. For junction voltages in the 30V range, the pn-breakdown voltage increases nearly one-to-one with the guard-ring voltage.

High positive voltages are applied to the $n^-$ well 26, electrons tunneled from the floating gate 16 to the $n^+$ well contact 18, and the floating gate 16 is used to guard the drain 18 and source 20 implants against pn breakdown. From the well's (26) perspective, the drain 18 and source 20 implants are at large negative voltages (although the voltages still are positive with respect to the substrate 28); consequently, for guarding, the floating gate 16 must also be at a large negative voltage. In a subthreshold pFET, the floating-gate voltage will always be near the source voltage; consequently, the floating gate is naturally at the proper potential for guarding. Simply by surrounding the drain 18 and source 20 implants with the floating gate 16, these junctions are guarded against pn breakdown during tunneling.

A guarded pFET remains a fully functional p-type MOSFET. The only differences between a guarded pFET and a conventional pFET are the larger well-voltage range, and larger drain-to-gate and source-to-gate overlap capacitances. Consequently, in a guarded-pFET synapse one can simultaneously (1) raise the well voltage, causing electron tunneling from the floating gate to the $n^+$ well contact, (2) adjust the drain and source voltages to effect subthreshold source currents, and (3) lower the drain voltage, causing Impact-Ionized Hot-Electron Injection.

Note that guarding the source junction of a n-type memory cell is impractical, because it would require the floating-gate voltage to be near the tunneling voltage, however, guarding the drain and source junctions of a p-type memory cell is trivial, requiring only that the floating-gate voltage be near the drain and source voltages. Thus the guard rings are compatible with standard MOS processing, and extend the $n^-$-to-$p^+$ breakdown voltage from approximately 17V to more than 75V.

Cell Arrays

Figure 11:
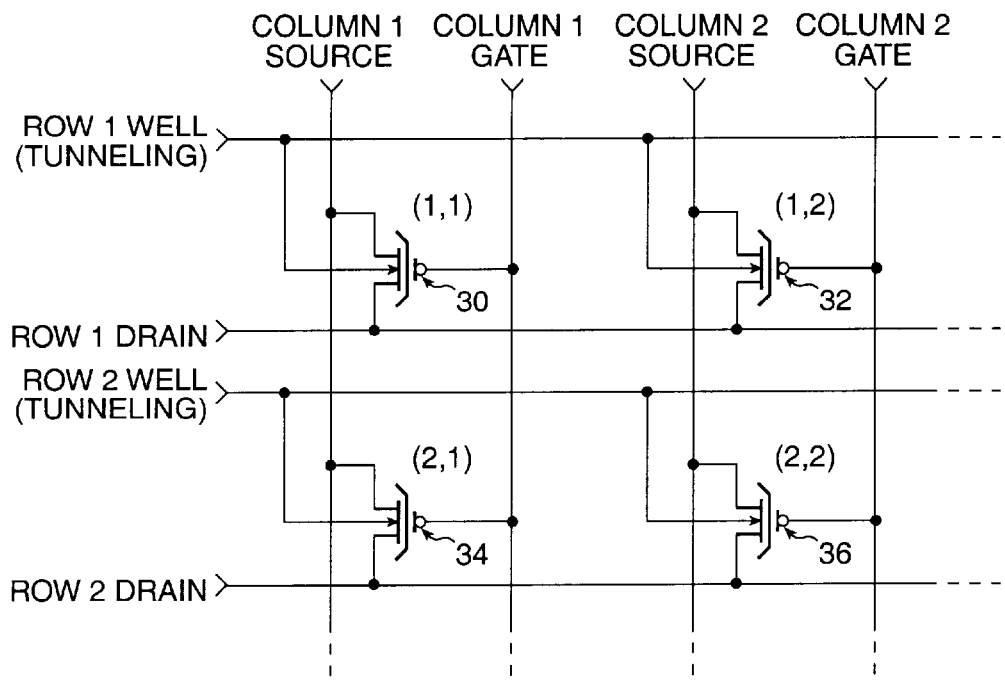
FIG. 11 is a schematic diagram of a 2×2 array of pMOS memory cells in accordance with a presently preferred embodiment of the present invention.
Figure 12:
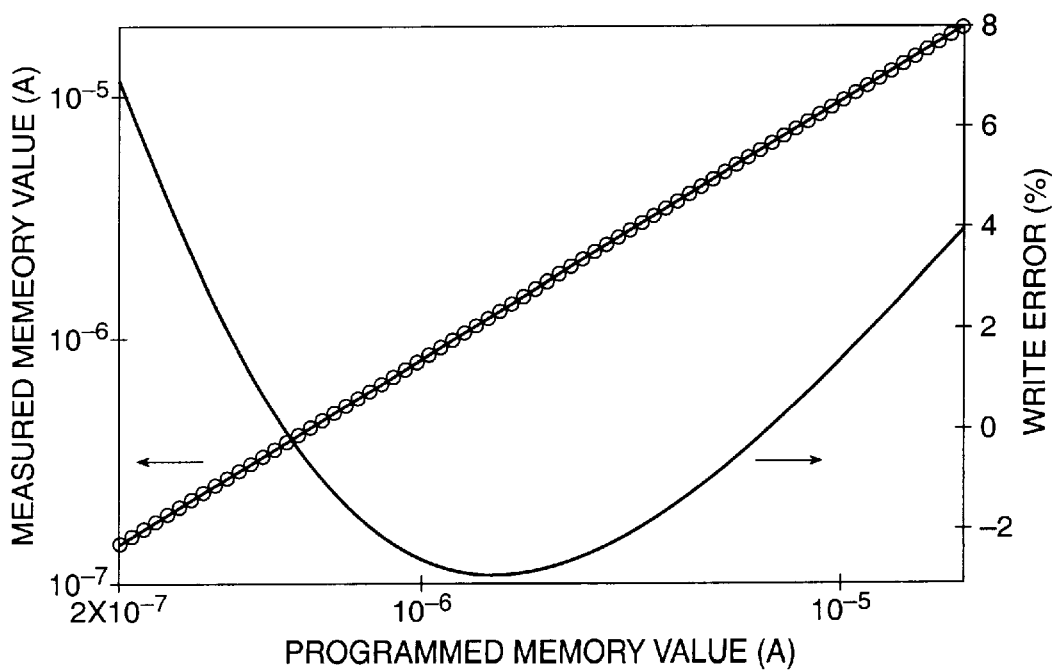
FIG. 12 is a plot of pMOS memory-cell input-output transfer function and output write error for a 1 sec write-pulse width.
Figure 13:
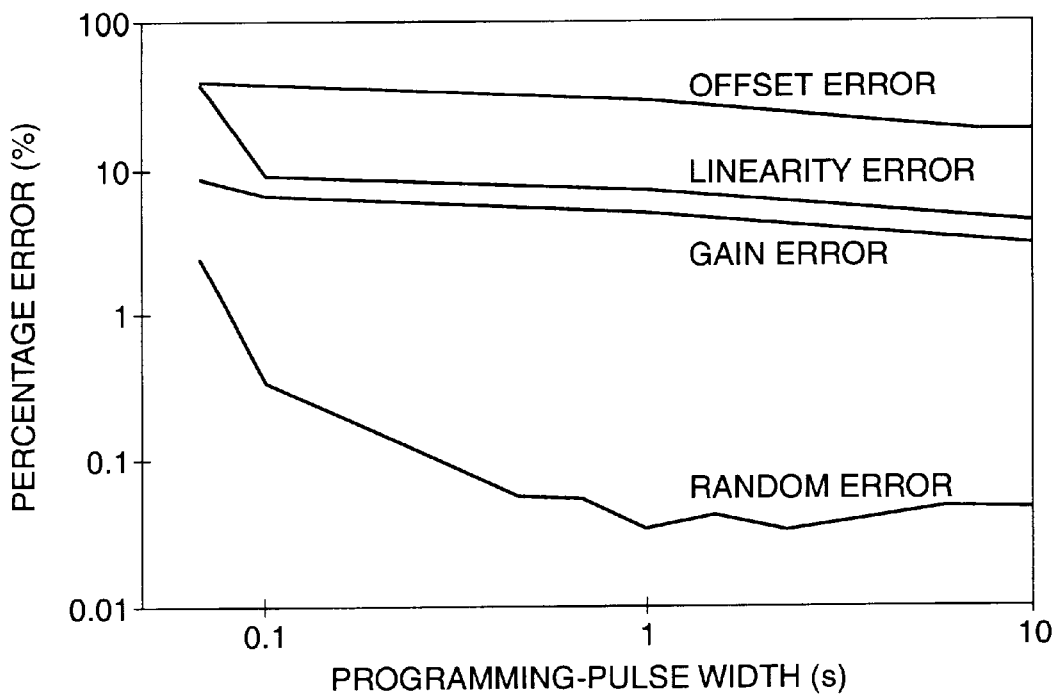
FIG. 13 is a plot of pMOS memory-cell write errors versus write-pulse width.

FIG. 11 is a schematic diagram of a 2×2 array of pMOS memory cells 30, 32, 34, 36. This array was fabricated to investigate memory resolution and crosstalk. Because a 2×2 array uses the same row-column addressing employed by larger arrays, it allows investigation of EEPROM performance without the complexity of a large number of devices. The memory resolution is shown in FIGS. 12 and 13; the write crosstalk to the other transistors—defined as the percentage change in memory value following a write and read of transistor (1,1)—is about 0.025%. For applications that require single-transistor, a high voltage is applied to the selected n-well row and a low voltage to the selected gate column. For applications that permit flash erasure of a column of transistors, the entire array is placed in a single n-well. To erase a column of transistors, a high voltage is applied to the n-well and a low voltage to the selected gate column. During cell erasure, if excessive tunneling occurs, the drain current may become small; when the cell is later written, the gate current will be small, and the memory write process will be slow. Therefore, all devices are preferably initialized after tunneling by (1) applying the minimum programming current, (2) lowering the gate voltage until the drain current is equal to this programming current, and (3) using the write-feedback process to hold this drain-current value as the gate is ramped back up to its nominal voltage.

Process

The present memory cell was fabricated in a 2 $\mu$m process, and uses an off-chip current source for programming. In addition, because the actual cell described herein was designed for another application, an enlarged (1 pF) gate capacitor was used along with an oversized (8 $\mu$m) channel length. Neither feature is needed in an analog EEPROM. Using a more modern process, the cell can easily be made substantially smaller.

Data Obtained

Figure 7:
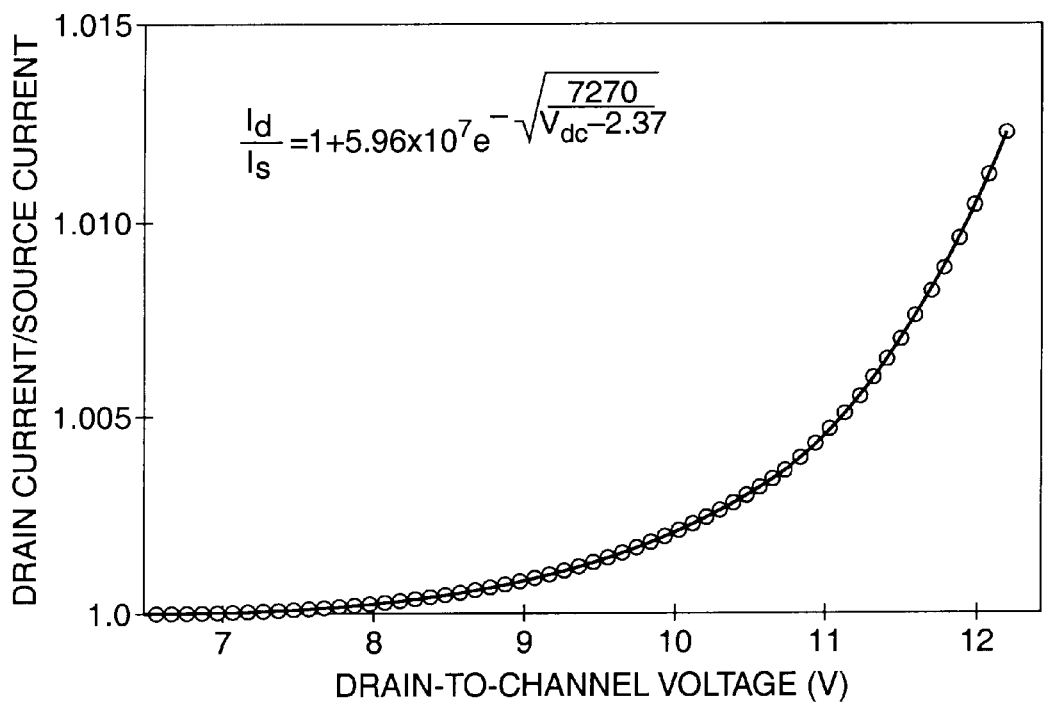
FIG. 7 is a plot of pFET impact ionization versus drain-to-channel potential $V_{dc}$ for a fixed subthreshold source current $I_S$=10 nA.

FIG. 7 is a plot of pFET impact ionization versus drain-to-channel potential $V_{dc}$, for a fixed, subthreshold source current $I_S$=10 nA. Because the probabilities of impact ionization and hot-electron injection vary with the channel potential, all terminal voltages are referenced to the channel. The results can be re-referenced to the source terminal using the relationship between source and channel potential in an MOS transistor. Because the drain-to-channel E-field increases with $V_{dc}$, the impact-ionization probability also increases with $V_{dc}$. These data in FIG. 7 are fit using a modified lucky-electron model.

FIG. 8 is a plot of pFET gate current versus drain-to-channel potential $V_{dc}$, for a fixed, subthreshold source current Is=10 nA. The source current is fixed, rather than the drain current, because the drain current increases with drain-to-channel potential as in FIG. 7. Because the drain-to-channel E-field increases with $V_{dc}$, the gate current also increases with $V_{dc}$. The empirical fit holds for 0.01 nA<$I_S$<1 $\mu$A.

FIG. 9 is a plot of pFET gate current versus source current, for a fixed drain-to-source voltage $V_{ds}$=12V. For silicon-learning applications, the preferred source-current range is 1 pA<$I_S$<100 nA, as described in co-pending U.S. patent application Ser. No. 08/845,018, referred to above. For analog EEPROM applications, the preferred source-current range is from about 20 nA to about 20 $\mu$A. Source currents smaller than 20 nA are to be avoided, because the hot-electron gate current, and therefore the memory write rate, are small. Because the pFET transconductance changes rapidly near threshold, source currents that are smaller than about 200 nA are also avoided, for reasons discussed in conjunction with FIG. 12. Above 20 $\mu$A, the potential at the drain end of the channel drops rapidly, and so does the gate current. For digital applications, the write rate may be maximized by using $I_S$–20 $\mu$A. pFETs fabricated in more modern processes will allow higher maximum source currents and faster memory-write rates.

FIG. 12 is a plot of pMOS memory-cell input-output transfer function and output write error, for a 1 sec write-pulse width. Here 64 logarithmically spaced drain-current values were written to transistor (1,1); log-scale currents were chosen to illustrate the memory cell's dynamic range. The drain current was reset to 100 nA prior to each write. To prevent writing the memory during reads, the drain voltages used for writing and reading must be different. Due to the intrinsic floating-gate-to-drain overlap capacitance, this voltage differential couples to the floating gate, causing an offset between the write current and the read current. Because the pFET transconductance is non-linear, this offset is nonconstant, and appears as both a gain error and a nonlinearity in the measured read-write transfer function.

FIG. 13 is a plot of pMOS memory-cell write errors versus write-pulse width. The experiment of FIG. 12 was performed using write-pulse widths ranging from 68 msec to 10 sec; here, the offset error (the maximum deviation between the measured current and the programmed current), the linearity error (the maximum deviation between the measured current and the best-fit line), the gain error (the deviation of the best-fit line from unity slope), and the random error (the RMS error after removal of the nonlinearity) is plotted versus the write-pulse width. Because an oversized (1 pF) gate capacitor is employed in this example, and an off-chip current source is used to write the memory, the setting times are long. The shorter the programming pulse width, the further the drain voltage is from its settled value when the programming current is removed, and the larger the errors.

Applications

The above-described pFET EEPROM can be utilized in a number of applications. For example, the pFET EEPROM can be used in an analog sound or speech recorder. Because the pFET EEPROM is inherently an analog device and permits simultaneous reading and writing, the analog input can be converted to sampled current values and written directly to the pFET EEPROM cells. Because writing the cells is a one-step process, storing analog memories in a pFET EEPROM is far simpler than in conventional analog sound or speech recorders, some of which at present utilize nFET EEPROMS and require an iterative write process (See, e.g., H. V. Tran, et al., supra.) Such nFET devices are presently manufactured by a company known as ISD.

In another application, a pFET EEPROM can be used in a multilevel digital memory. If each memory cell is used, for example, to store 8-bit memory values, then with proper decoding, a 1 kilo cell memory can store 8 kilobits of digital memory. Although nFET EEPROMS have been used in multi-level memories (see, e.g., devices produced by Mitsubishi Electric Company of Japan and Intel Corporation), the iterative memory-write process required by these nFET devices forces the write process to be unacceptably slow. To achieve high accuracy requires many iterative write passes. Such multi-level memories have therefore seen only limited use in conventional electronics. Because the new pFET write process is single-step and accurate it can be fast and can compete with digital memory systems.

In another application, a pFET EEPROM can be used as a synapse transistor. In a pFET synapse device, the pFET EEPROM will prove to be a preferred device over other pFET structures, because the layout requires substantially less layout area, thereby allowing more devices to be placed on a silicon chip.

In another application, a pFET EEPROM can be utilized in autozeroing, adaptive devices. In such devices, the pFET EEPROM will prove to be a preferred device over other pFET structures.

In another application, a pFET EEPROM can eliminate the BIOS memory in conventional digital computers. Existing computers typically store their startup code in a BIOS, which may be a flash EEPROM usually located on the same printed circuit board as the microprocessor. The startup code typically is not stored on the microprocessor IC, because the MOS processing required to build nFET EEPROM cells requires added processing steps when compared to the MOS processing required to build the microprocessor. These added processing steps reduce the chip yield, increasing the microprocessor cost. Because the pFET EEPROM is fabricated in a standard process, it allows a BIOS memory to be added to a microprocessor IC without additional processing steps. This will be advantageous because locating the Bios memory on board the microprocessor IC will reduce cost, enhance speed and have no adverse effect on yield.

A further application for a pFET EEPROM is to add nonvolatile memory to existing ASIC processes. ASIC processes typically do not possess any form of nonvolatile memory for the reasons set forth above. Because the pFET EEPROM is compatible with standard MOS processing, it will allow ASIC vendors to add nonvolatile, mixed analog—digital memory to their existing processes, with no changes to the process. This change will add nonvolatile memory devices to the repertoire of cells available to ASIC designers, with endless new design possibilities.

Alternative Embodiments

In a specialized process it is possible to eliminate the guard rings and use graded drain and source junctions. Graded junctions have lower E-fields, thereby preventing well-to-drain (and source) pn breakdown during tunneling. Accordingly, memories constructed in this fashion are included in the present invention.

Another alternative is to form a tunneling junction where electrons are tunneled through a gate-oxide surface to the n-well rather than at an edge of an n+ well implant (in the FIG. 6 embodiment, electrons tunnel from the floating gate 16 to the n+ implant 18 at the edge thereof).

Figure 14A:
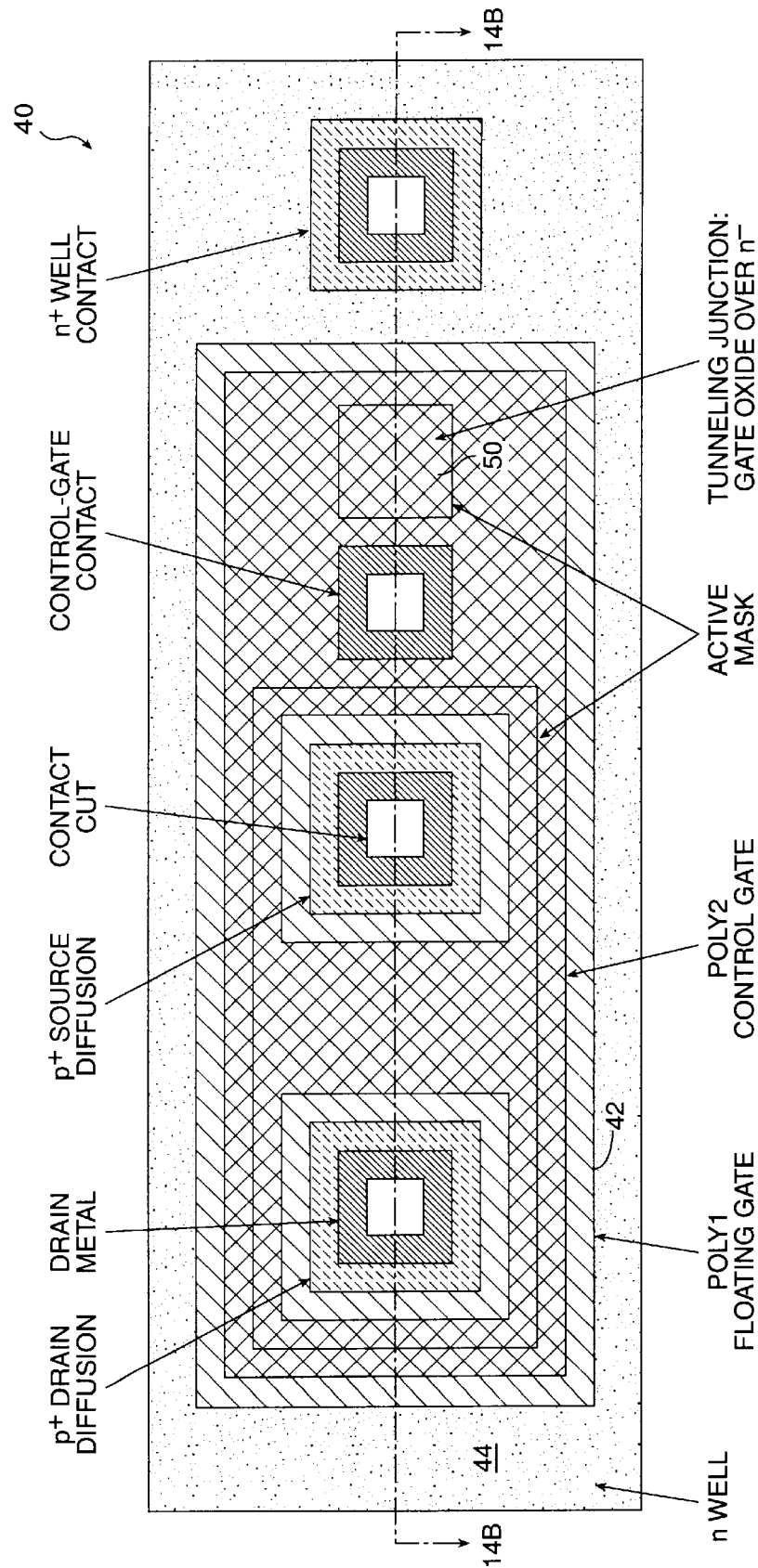
FIG. 14A is a top view of a guarded -pFET synapse incorporating a bowl-shaped tunneling junction.
Figure 14B:
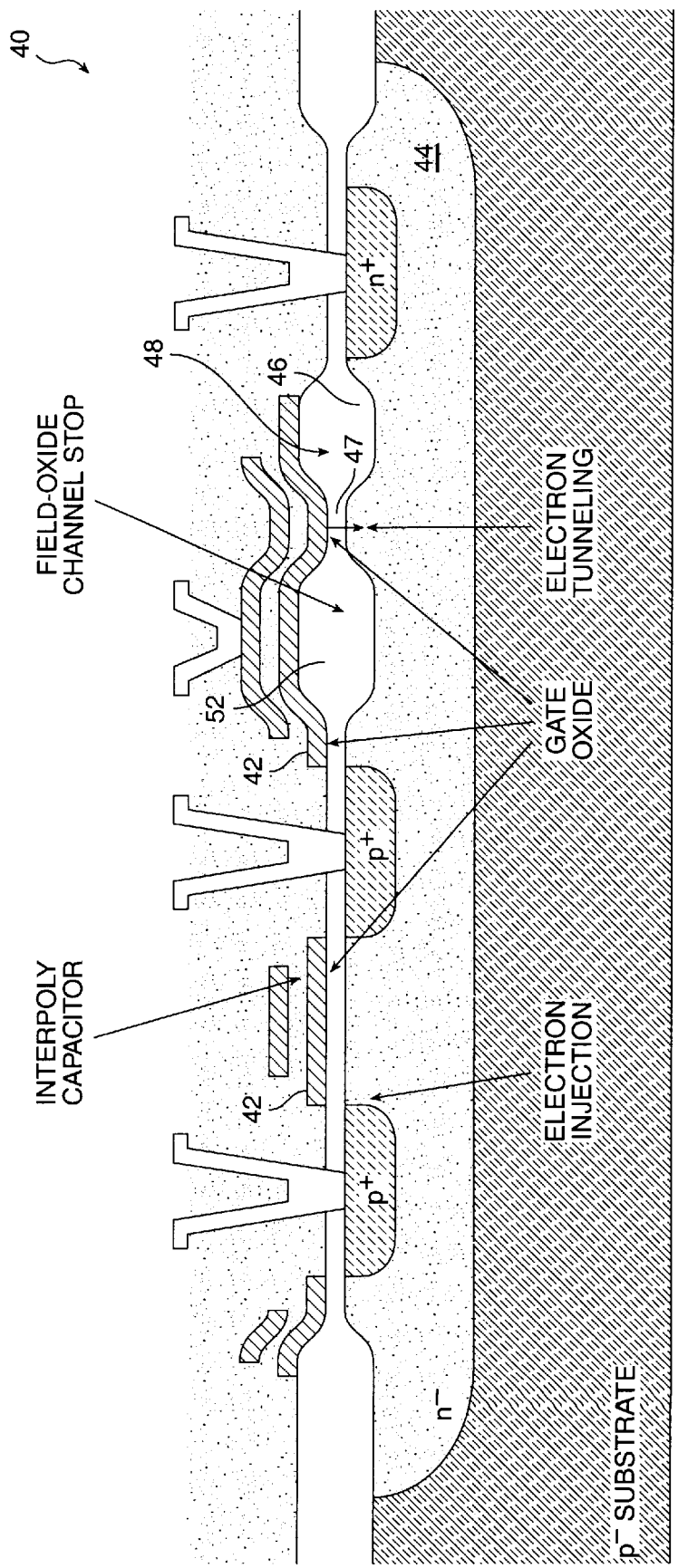
FIG. 14B is a cross-sectional view of the device of FIG. 14A taken along line 14B—14B of FIG. 14A.

During tunneling, field-oxide-induced junction breakdown at the n⁺ tunneling-well contact causes a leakage current to flow from the well contact to the pFET's drain and source. Alternate tunneling junctions were therefore investigated where the floating gate does not abut the n⁺ tunneling-well contact. A guarded-pFET synapse without a floating-gate extension to the n⁺ well contact was built in the hopes of inducing FN tunneling through the gate oxide that subtends the channel. Unfortunately, the pFET's source potential pins the MOS-channel potential; consequently, the channel is at or near the source voltage, rather than near the well-contact voltage, and the resulting oxide voltage is insufficient for tunneling (note: this is not necessarily true for gate oxides thinner than about 50 Å). To isolate the tunneling region from the pFET's source, the guarded-pFET synapse 40 shown in FIGS. 14A and 14B was built. In this device, electrons tunnel from the floating gate 42 to the n⁻ well 44 through a tunneling junction 46 through gate-oxide surface 47.

In this version a presently preferred embodiment of the pFET's (40) floating gate 42 is extended over a region of field oxide 48, and an isolated, 4 μm×4 μm square bowl of gate oxide 50 is placed within this field oxide region. The gate-oxide bowl 46 has n⁻ silicon 44 beneath it, the polysilicon floating gate 42 above it, and field oxide 52 on all four sides. A high voltage is applied to the n⁻ well 44, causing electrons to tunnel from the floating gate 42, through the gate-oxide bowl 46, to the n⁻ well 44. The floating gate 42 depletes the n⁻ silicon immediately beneath the bowl 46 causing a potential drop from the bulk n⁻ to the MOS surface. Consequently, bowl tunneling requires well voltages roughly 5V higher than those required to tunnel at an n⁺ well contact. However, because the tunneling is through a gate-oxide surface, rather than at an edge, oxide trapping is reduced.

Bowl-shaped tunneling junctions do not exhibit the leakage currents observed at n⁺ well-contact tunneling junctions.

Figure 15:
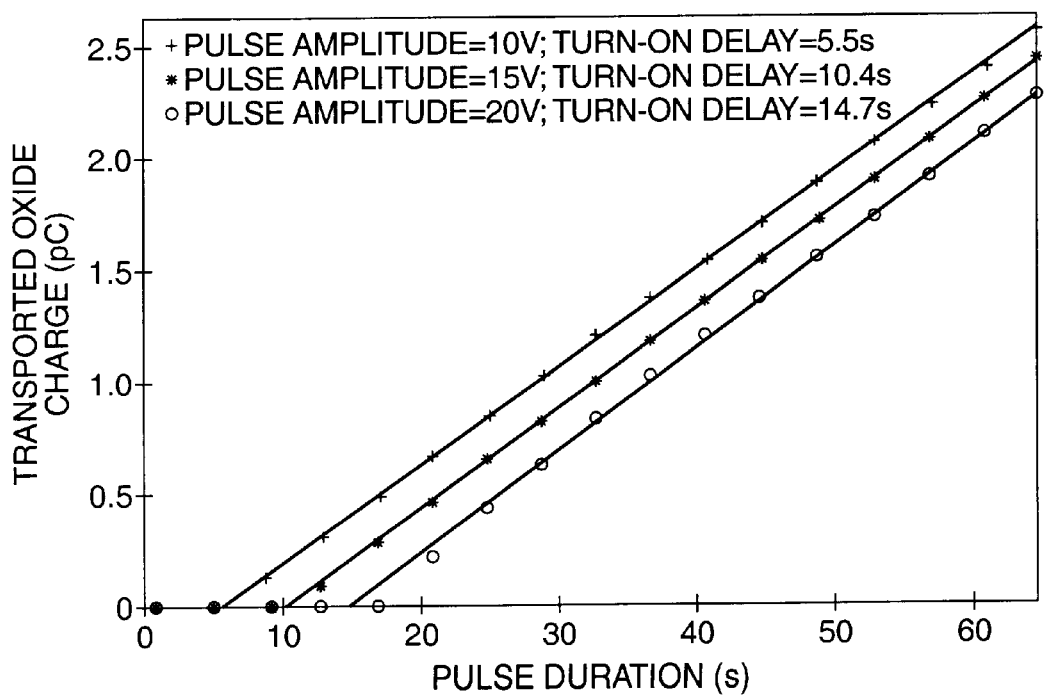
FIG. 15 is a plot of the bowl-shaped tunneling junction turn-on delay.

Although this type of tunneling junction does eliminate the pn-breakdown problem, its turn-on delay (the delay between applying a high well voltage and the onset of electron tunneling) is generally long. In FIG. 15, the amount of charge tunneled through a bowl-shaped oxide, versus the amount of time the well voltage was pulsed high, for three different well-pulse voltage amplitudes is shown. The turn-on delay can exceed ten seconds—an impracticably long time for a pulse-based learning system. The cause is the depletion region that forms at the silicon surface beneath the bowl. As a result of the voltage differential between the floating gate and the n⁻ well, the surface region beneath the gate oxide is depleted, and the depletion-region depth varies with the voltage differential between the floating gate and the well. If the well is pulsed high, holes must be provided to the silicon surface to widen this depletion region. Unfortunately, the only hole source is thermal carrier generation. Consequently, the depletion region takes many seconds to widen. Although such tunneling junctions can be used in systems for which the well-tunneling voltage is a slowly varying analog quantity, they cannot be used in systems in which synapses are pulse-tunneling.

In specialized processes, vendors can increase the bulk n⁻ doping beneath the bowl-shaped oxide, i.e., they can convert that part of the n⁺ well to n⁺ to reduce the turn-on delay. While the delay will always exist, it can be reduced to the order of nanoseconds with this technique, and thus made inconsequential.

Although illustrative presently preferred embodiments and applications of this invention are shown and described herein, many variations and modifications are possible which remain within the concept, scope, and spirit of the invention, and these variations would become clear to those of skill in the art after perusal of this application. The invention, therefore, is not to be limited except in the spirit of the appended claims.

What is claimed is:

1. A semiconductor structure for long-term learning comprising:

a p- type region disposed within a semiconductor substrate;

an n- type well region disposed within said p- type region;

a first p+ type region disposed within said n- type well region;

a second p+ type region disposed within said n- type well region;

a floating gate disposed over a channel region and separated from said channel region by a first insulating layer, said channel region disposed in said n+ type well region between said first p+ type region and said second p+ type region;

a tunneling junction region disposed adjacent to a portion of said floating gate, said tunneling junction region including a first conductive region separated from said floating gate by an insulating material;

a second insulating layer disposed over said floating gate; and a second conductive region disposed over said second insulating layer and capacitively coupled to said floating gate;

means for selectively causing electrons to inject from said channel region through said first insulating layer onto said floating gate; and means for selectively causing electrons to tunnel from said floating gate through said tunneling junction region.

2. A semiconductor structure according to claim 1 including means for simultaneously causing electron injection onto said floating gate and electron tunneling from said floating gate.

3. A semiconductor structure for long-term learning comprising:

a p– type region disposed within a semiconductor substrate;

an n– type well region disposed within said p– type region;

a first p+ type region disposed within said n– type well region;

a second p+ type region disposed within said n– type well region;

an n+ type well region disposed within said n– type region;

a floating gate disposed over a channel region and separated from said channel region by a first insulating layer, said channel region disposed in said n– type well region between said first p+ type region and said second p+ type region;

a second insulating layer disposed over said floating gate;

a gate conductive region disposed over said second insulating layer and capacitively coupled to said floating gate;

means for selectively causing electrons to inject from said channel region through said first insulating layer into said floating gate; and means for selectively causing electrons to tunnel from said floating gate to said n+ type well region through said first insulating layer.

4. The semiconductor structure according to claim 3 including means for simultaneously causing said electron injection and said electron tunneling.

5. A semiconductor structure for long-term learning comprising:

a p– type region disposed within a semiconductor substrate;

an n– type well region disposed within said p– type region;

a first p+ type region disposed within said n– type well region;

a second p+ type region disposed within said n– type well region;

a floating gate disposed over a channel region and separated from said channel region by a first insulating layer, said channel region disposed in said n-type well region between said first p+ type region and said second p+ type region;

a tunneling junction region disposed adjacent to a portion of said floating gate, said tunneling junction region including a first conductive region separated from said floating gate by an insulating material;

a second insulating layer disposed over said floating gate;

a gate conductive region disposed over said second insulating layer and capacitively coupled to said floating gate; and means for simultaneously adding and removing electrons to and from said floating gate, wherein said electron addition is accomplished through selective use of electron injection and said electron removal is accomplished through selective use of electron tunneling.

* * * * *

UNITED STATES PATENT AND TRADEMARK OFFICE
CERTIFICATE OF CORRECTION

PATENT NO. : 6,125,053        Page 1 of 4
DATED : September 26, 2000
INVENTOR(S) : Christopher J. Diorio and Carver A. Mead It is certified that error appears in the above-identified patent and that said Letters Patent is hereby corrected as shown below:

Column 7,
Line 45, replace "programing" with --programming--.

Cover page,
Under "References cited" please add the following references:

| | | |
|---|---|---|
| --3,893,151 | 07/01/75 | Bosselaar, et al. |
| 4,420,871 | 12/20/83 | Scheibe |
| 4,622,656 | 11/11/86 | Kamiya, et al. |
| 4,822,750 | 4/18/89 | Perlegos, et al. |
| 4,935,702 | 06/19/90 | Mead, et al. |
| 4,953,928 | 09/04/90 | Anderson, et al. |
| 5,059,920 | 10/22/91 | Anderson, et al. |
| 5,068,622 | 11/26/91 | Mead, et al. |
| 5,146,106 | 09/08/92 | Anderson, et al. |
| 5,160,899 | 11/03/92 | Anderson, et al. |
| 5,166,562 | 11/24/92 | Allen, et al. |
| 5,331,215 | 07/19/94 | Allen, et al. |
| 5,336,936 | 08/09/94 | Allen, et al. |
| 5,345,418 | 09/06/94 | Challa |
| 5,463,348 | 10/31/95 | Sarpeshkar, et al. |
| 5,541,878 | 07/30/96 | LeMoncheck, et al. |
| 5,627,392 | 05/06/97 | Diorio, et al. |
| 5,687,118 | 11/11/97 | Chang |
| 5,734,288 | 03/31/98 | Dolazza, et al. |
| 5,763,912 | 06/09/98 | Parat, et al. |
| 5,777,361 | 07/07/98 | Parris, et al. |
| 5,009,156 | 03/24/92 | Delbruck, et al. |
| 5,103,116 | 04/07/92 | Sivilotti, et al. |
| 5,319,268 | 06/07/94 | Lyon, et al. |
| 5,376,813 | 12/17/94 | Delbruck, et al. |
| 5,825,063 | 10/20/98 | Diorio, et al. |
| 5,875,126 | 02/23/99 | Minch, et al. |
| 5,898,613 | 04/27/99 | Diorio, et al. |
| 5,914,894 | 06/22/99 | Diorio, et al. |

UNITED STATES PATENT AND TRADEMARK OFFICE
CERTIFICATE OF CORRECTION

PATENT NO. : 6,125,053
DATED : September 26, 2000
INVENTOR(S) : Christopher J. Dioro and Carver A. Mead It is certified that error appears in the above-identified patent and that said Letters Patent is hereby corrected as shown below:

Dioro, et al., "A High-Resolution Non-Volatile Analog Memory Cell," 1995, IEEE Intl. Symp. On Circuits and Systems, Vol. 3, pp. 2233-2236.

Gray, et al., "Analysis and Design of Analog Integrated Circuits", 1984, John Wiley & Sons, pp. 67-71.

Hasler, et al., "An Autozeroing Amplifier Using PFET Hot-Electron Injection", May 12-15 1996, IEEE International Symposium on Circuits and Systems, Vol. 3.

Hasler, et al., "An Autozeroing Floating-Gate Amplifier", IEEE Journal of Solid State Circuits, pp. 1-15.

Hasler, et al., "Single Transistor Learning Synampse", 1995, Advances in Neural Information Processing Systems, Vol. 3, pp. 1660-1663.

Hocket, et al., "Implementation of a Learning Kohonen Neuron Based on a New Multilevel Storage Technique", March 1991, IEEE J. Solid-State Circuits, Vol, 26, No. 3, pp. 262-267.

Hollis, et al., " A Neural Network Learning Algorithm Tailored for FLSI Implementation", September 1994, IEEE Trans. On Neural Networks, Vol. 5, pp. 784-791.

Hu, et al., "Hot-Electron-Induced MOSFET Degradation-Model, Monitor, and Improvement", Feb. 1985, IEEE Transactions on Electron Devices, Vol. ED- 32, No. 2, pp. 375-385.

UNITED STATES PATENT AND TRADEMARK OFFICE
CERTIFICATE OF CORRECTION

PATENT NO. : 6,125,053
DATED : September 26, 2000
INVENTOR(S) : Christopher J. Dioro and Carver A. Mead It is certified that error appears in the above-identified patent and that said Letters Patent is hereby corrected as shown below:

Ismail, "Neural Information Processing II," 1994, Analog VLSI Signal and Information Process, New York: McGraw-Hill, Inc., pp. 358-413

Johnson, "Neural Team Bares Silicon Brain", July 3, 1995, Electronic Engineering Times, Page 1 and 31.

Johnson, "Mead Envisions New Design Era", July 17, 1995, Electronic Engineering Times, Pages 1, 37, 38.

Lazzaro, et al., "Systems Technologies for Silicon Auditory Models," June 1994, IEEE Micro, Vol. 14, No. 3, pp. 7-15, T.

Leblebici, et al., "Hot-Carrier Reliability of MOS VLSI Circuits", 1993, Kluwer Academic, 46-49.

Masuoka, et al., "Reviews and Prospects of Non-Volatile Semiconductor Memories," April 1991, IEICE Trans., Vol E 74, no. 4pp. 868-874.

Mead, et al., Introduction to VLSI Systems, Addison-Wesley Pub. Co., 1980 pp. 1-5.

Mead, "Analog VLSI and Neural Systems", Addison-Wesley Pub. Co., pp. 163-173.

Minch, "A vMOS Soft-Maximum Current Mirror," 1995 IEEE, vol. 3, pp. 2249-2252.

UNITED STATES PATENT AND TRADEMARK OFFICE
CERTIFICATE OF CORRECTION

PATENT NO. : 6,125,053
DATED : September 26, 2000
INVENTOR(S) : Christopher J. Dioro and Carver A. Mead It is certified that error appears in the above-identified patent and that said Letters Patent is hereby corrected as shown below:

Minch, et al., "Translinear Circuits Using Subthreshold Floating-Gate MOS Transistors," 1996, Analog Integrated Circuits and Signal Processing, vol 9, No. 2 pp. 167-179.

Sanchez et al., "Review of Carrier Injection in the Silicon/Silicon-Dioxide System", June 1991, IEEE Proceedings-G, Vol. 138, No. 3, pp 377-389.

Sarpeshkar, et al., "White Noise in MOS Transistors and Resistors," Nov.1993, IEEE Circuits and Devices, pp. 23-29.

Sarpeshkar, et al., "A Low-Power Wide-Linear-Range Transconductance Amplifier", Analog Intergrated Circuits and Signal Processing, in Press, pp. 1-28.

Tsividis, et al., "Continuous-Time MOSFET-C Filters in VLSI", February 1986, IEEE Transactions on Circuits and Systems, Vol. 33, No. 2, pp. 125-140.--

Signed and Sealed this

Twenty-sixth Day of June, 2001

*Attest:*

*Attesting Officer*

NICHOLAS P. GODICI
*Acting Director of the United States Patent and Trademark Office*